United States Patent [19]

Carichner

[11] Patent Number: 5,550,403
[45] Date of Patent: Aug. 27, 1996

[54] IMPROVED LAMINATE PACKAGE FOR AN INTEGRATED CIRCUIT AND INTEGRATED CIRCUIT HAVING SUCH A PACKAGE

[75] Inventor: Karla Carichner, Pleasanton, Calif.

[73] Assignee: LSI Logic Corporation, Milpitas, Calif.

[21] Appl. No.: 252,692

[22] Filed: Jun. 2, 1994

[51] Int. Cl.$^6$ .................................................. D01L 23/48
[52] U.S. Cl. ........................ 257/702; 257/746; 257/747; 257/794; 257/697
[58] Field of Search .................................. 257/666, 702, 257/746, 747, 789, 793, 795, 787, 794, 737, 738, 697

[56] References Cited

U.S. PATENT DOCUMENTS

| | | | |
|---|---|---|---|
| 4,139,859 | 2/1979 | Lewis et al. | 257/746 |
| 4,142,203 | 2/1979 | Dietz | 257/704 |
| 4,355,463 | 10/1982 | Burns | 257/666 |
| 4,649,415 | 3/1987 | Hebert | 257/702 |
| 4,656,499 | 4/1987 | Butt | 257/704 |
| 4,680,617 | 7/1987 | Ross | 257/659 |
| 4,691,225 | 9/1987 | Murakami et al. | 257/702 |
| 4,691,255 | 9/1987 | Murakami et al. | 257/702 |
| 4,833,102 | 5/1989 | Byrne et al. | 257/704 |
| 4,864,384 | 9/1989 | Boudot et al. | 257/728 |
| 4,868,638 | 9/1989 | Hirata et al. | 257/702 |
| 4,935,581 | 6/1990 | Komathu | 174/52.4 |
| 5,070,041 | 12/1991 | Katayama et al. | 437/214 |
| 5,073,425 | 12/1991 | Dees, Jr. et al. | 257/308 |
| 5,103,293 | 4/1992 | Bonajino et al. | 257/702 |
| 5,242,755 | 9/1993 | Keller et al. | 428/457 |
| 5,291,062 | 3/1994 | Higgins | 257/702 |

FOREIGN PATENT DOCUMENTS

| | | | |
|---|---|---|---|
| 62-86745 | 2/1987 | Japan | 257/794 |
| 62-106635 | 5/1987 | Japan | 257/697 |
| 3203357 | 9/1991 | Japan | 257/701 |

Primary Examiner—Sara W. Crane
Assistant Examiner—Jhihan Clark
Attorney, Agent, or Firm—Poms, Smith, Lande & Rose

[57] ABSTRACT

An integrated circuit package, and integrated circuit assembly having such a package, includes a base portion and a cover portion which cooperatively enclose an integrated circuit chip. The base and cover portions are formed of composite material and have matching coefficients of thermal expansion. Because the base and cover portions each match the other's thermal expansions and contractions, no stresses are generated in the package from heating and cooling during and following operation of the integrated circuit chip, and no such thermally produced physical stresses are transferred to the circuit chip to shorten its life. A version of the package includes plural lamina, and may include facial metallic coating layers on the lamina for shielding, electromagnetic shielding, and electrical interconnection of the integrated circuit chip. Another version of the package utilizes the facial metallic coating layers to join portions of the package by soldering.

13 Claims, 2 Drawing Sheets

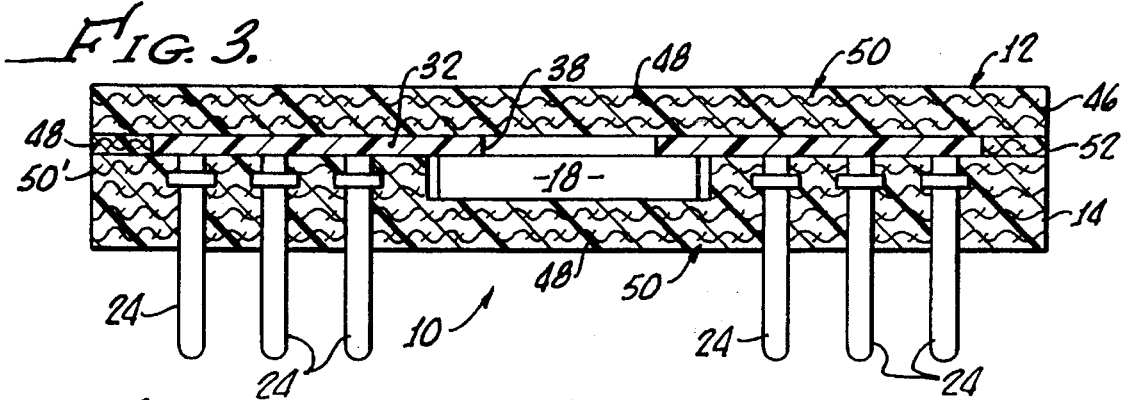
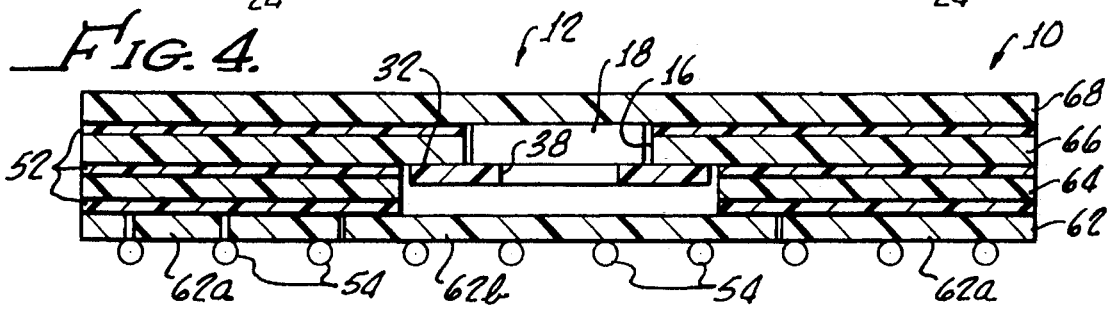
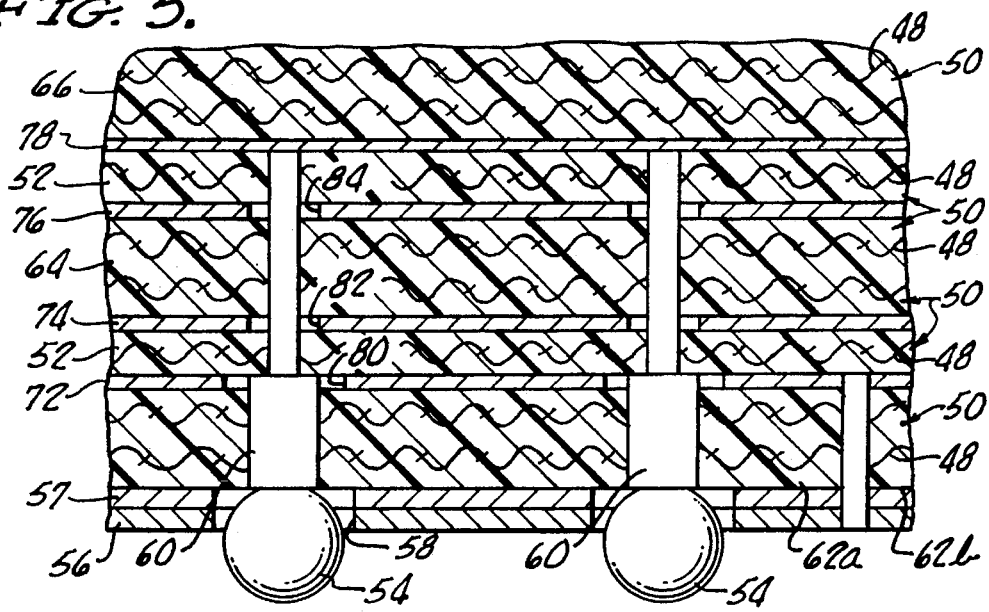
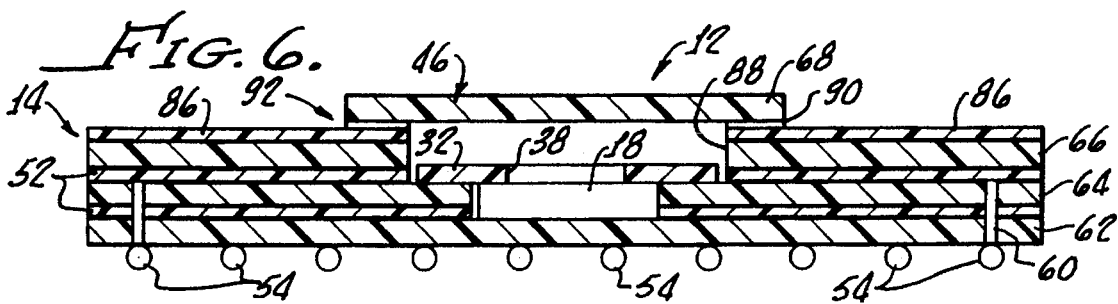

IMPROVED LAMINATE PACKAGE FOR AN INTEGRATED CIRCUIT AND INTEGRATED CIRCUIT HAVING SUCH A PACKAGE

BACKGROUND OF THE INVENTION

1. Field of the Invention

The present invention is in the field of packages for integrated circuit dies, and integrated circuits having such packages. More particularly, the present invention relates to an integrated circuit having a package including a base portion and a cover portion, each of which are fabricated of the same material, and therefore each having a thermal coefficient of expansion matching the other.

2. Related Technology

Integrated circuits are known with packages having a base portion of plastic defining an upwardly open recess into which the circuit die is received. An epoxy encapsulant is received into the package over the circuit die, and a metallic cover, which is usually formed of aluminum, may also be placed over the encapsulant to finish the package and enclose the circuit die. Another version of conventional package structure includes a base portion made of plastic with a downwardly opening cavity for the circuit die. These packages generally include a ceramic cover member for the circuit die cavity. The ceramic cover is generally attached to the base portion using a b-stage epoxy frit, that is, a partially cured epoxy carried in a fibrous fabric carrier.

In each case outlined above, the material mismatch between the cover and base portions of the package causes thermally-induced stresses in the package when the integrated circuit is in operation. That is, the operation of the integrated circuit generates heat which is transferred to the package. Because the base and cover portions of the package have differing coefficients of thermal expansion, they expand and contract at different rates during thermal cycling of the package as the integrated circuit die heats during operation and cools after a period of operation. These stresses are in part transferred to the integrated circuit die itself, and to the interconnect structures between the circuit die and the package. Of course these stresses can cause physical distortions of the package and integrated circuit die, and can cause or contribute to failure of the circuit die or of the interconnect structure of the package, for example.

Such a conventional integrated circuit and package is known in accord with U.S. Pat. No. 4,868,638, issued 19 Sep. 1989, to A. Hirata, et al. The '638 patent is believed to teach a package with a base or carrier member which is fabricated of suitable heat-resistant material. For example, the base may be fabricated of polyphenylene sulphide, polysulphone, polyethersulphone, polyarysulphone, phenol, polyamide, or epoxy resin. A heat sink member is molded into the carrier member, and an encapsulant material may or may not be employed. A plate or cover member, of glass or clear epoxy resin, for example, is joined to the carrier. Another version of this package uses a TAB (tape automated bonding) type of interconnect. However, such a TAB interconnect device may similarly be damaged or dislodged by physical shock and vibration. The mismatch of thermal expansion coefficient between the carrier portion and the cover portion of the package is not addressed by the '638 patent.

Other conventional integrated circuits having packages with base and cover portions made of the same material are seen in U.S. Pat. Nos. 4,142,203, issued 27 Feb. 1979, to R. Dietz; 4,355,463, issued 26 Oct. 1982, to C. Burns; 4,833, 102, issued 23 May 1989, to R. Byrne, et al. All of these patents use a ceramic base portion and a ceramic cover portion to form the integrated circuit package, perhaps with other components, such as a heat sink member, added as well. However, in each case the package will have an undesirably high manufacturing cost because of the use of the ceramic material, and associated costly and time-consuming processing steps.

Other teachings for integrated circuit packaging which attempt to deal with the problem of differing thermal coefficients of expansion of the package component parts with little or no success, or which simply ignore this problem, are seen in U.S. Pat. Nos. 4,656,499, issued 7 Apr. 1987, to S. Butt; 4,864,384, issued 5 Sep. 1989, to M. Boudot, et al; and 5,070,041, issued 3 Dec. 1991, to S. Katayama, et al.

SUMMARY OF THE INVENTION

In view of the deficiencies of conventional packages for integrated circuits, and of integrated circuits having such packages, a primary object for the present invention is to provide an inexpensive package for an integrated circuit, and an integrated circuit having such a package, which includes a base portion and a cover portion each of which are formed of the same material, and are therefore matched to one another with respect to their coefficient of thermal expansion. In other words, the structural components of the integrated circuit package are materially homogeneous, and no differential thermal expansions can occur between these structural components of the package.

More particularly, the present invention has as an object the provision of an integrated circuit package, and an integrated circuit having such a package, in which the package includes a base portion and a cover portion each of which are formed of the same fibrous material in a polymeric or resinous matrix. Because the package portions are each formed of the same low-cost material, and have matching coefficients of thermal expansion, the integrated circuit die mounted in the package is never subject to stresses caused by differential thermal expansion between the base and cover portions.

Yet another object for the present invention is to provide such an integrated circuit package, and integrated circuit having such a package, in which the base portion and cover portion are sealingly secured together by an interposed adhesive layer of material which is compatible with or the same as the material of the base and cover portions.

Still another object of the present invention is to provide such an integrated circuit package, and integrated circuit having such a package, in which the package is formed of plural laminae of woven fibrous material in a matrix of polymeric or resinous material, and the laminae are secured together by intervening layers of resinous material which includes woven fibrous material. The intervening layers are applied during manufacture of the package in a b-state, or partially cured condition. Upon curing of the intervening layers, the base and cover portions of the integrated circuit package are materially homogeneous so that no differential thermal expansions occur in the package during operation of the integrated circuit, and no thermally induced stresses can be transferred to the integrated circuit die.

Another object for the present invention is to provide an integrated circuit package in which the base and cover portions of the package are formed of laminae which include a woven fibrous material in a matrix of resinous or polymeric material, and in which selected surfaces of the laminae carry metallic coatings. The metallic coatings of the various surfaces of the laminae may be employed to form interconnection traces between external connection features of the package and the circuit die, to form ground or power connections within the circuit package, or to form sealing connections or attachments of adjacent layers of the laminae to one another. In this way, the base and cover portions of the package may be sealingly attached to one another by means of soldering interfacial metallized layers of these components one to another. The metallized layer may also effect shielding, such as electromagnetic shielding, for the circuit die.

Accordingly, the present invention provides an integrated circuit assembly having an integrated circuit die, and a package enclosing the die and providing for electrical interconnection of the die to external electrical circuitry, the package includes a first package portion or base providing a recess into which the integrated circuit die is received, a second package portion or cover sealingly cooperating with the first package portion to enclose the integrated circuit die within the recess, means for effecting corresponding individual electrical interconnection between plural electrical contact pads of the integrated circuit die and plural electrical connection features defined on the package for connection with the external electrical circuitry, and the package portions are materially uniform and matched in thermal coefficient of expansion to one another.

The base and cover portions of the package are preferably fabricated of a woven fibrous material in a matrix of polymeric or resinous material. A layer of adhesive material, which is the same as or which is compatible with the polymeric or resinous matrix material of the base and cover, sealingly secures this base and cover together. Consequently, the package is substantially free of thermally-induced stresses during operation of the integrated circuit, with consequent heating of the package. The package may be of ball-grid array type, or of pin-grid array type, for example, and may be configured with the cavity for receipt of the integrated circuit die disposed either up or down, as is desired. The package may also be fabricated of plural laminae of the same material, which laminae are held sealingly together by an adhesive layer which is the same as or compatible with the matrix material of the package itself, and which is in a partially cured or cross linked condition during manufacture of the package. This partially cured material is finish cured to secure the laminae of the package sealingly together. Another alternative construction of the present package includes metallized layers on confronting surfaces of the package laminae, which confronting surfaces are soldered together during manufacture of the integrated circuit package to enclose the circuit die. Similar metallized surfaces at this and other locations of the laminated package may be employed to form interconnects, power, ground, or other necessary electrical connections in the package for the integrated circuit therein.

An advantage of the present invention is that the package portions do not have differing thermal coefficients of expansion, and do not experience differential thermal growths and contractions as the package heats and cools during and after a period of operation of the circuit die. Consequently, the package does not generate any physical stresses or strains which otherwise could undesirably be transferred to the circuit die, or to its electrical interconnection structures, shortening the service life of the circuit assembly. The present inventive integrated circuit package offers circuit assemblies of improved longevity.

BRIEF DESCRIPTION OF THE DRAWINGS

FIG. 3 provides an enlarged partially cross sectional view of the integrated circuit package and circuit chip taken generally along line 3—3 of FIG. 1; and FIG. 4 is a cross sectional view of an alternative embodiment of an integrated circuit package and integrated circuit assembly embodying the present invention, and being of plastic package ball-grid array surface mount technology type;

FIG. 5 is an enlarged fragmentary cross sectional view of an encircled portion of FIG. 4; and FIG. 6 provides a cross sectional view similar to that of FIG. 4, and showing an alternative embodiment of the present integrated circuit assembly and package.

DESCRIPTION OF THE PREFERRED EXEMPLARY EMBODIMENTS OF THE INVENTION

Figure 1:
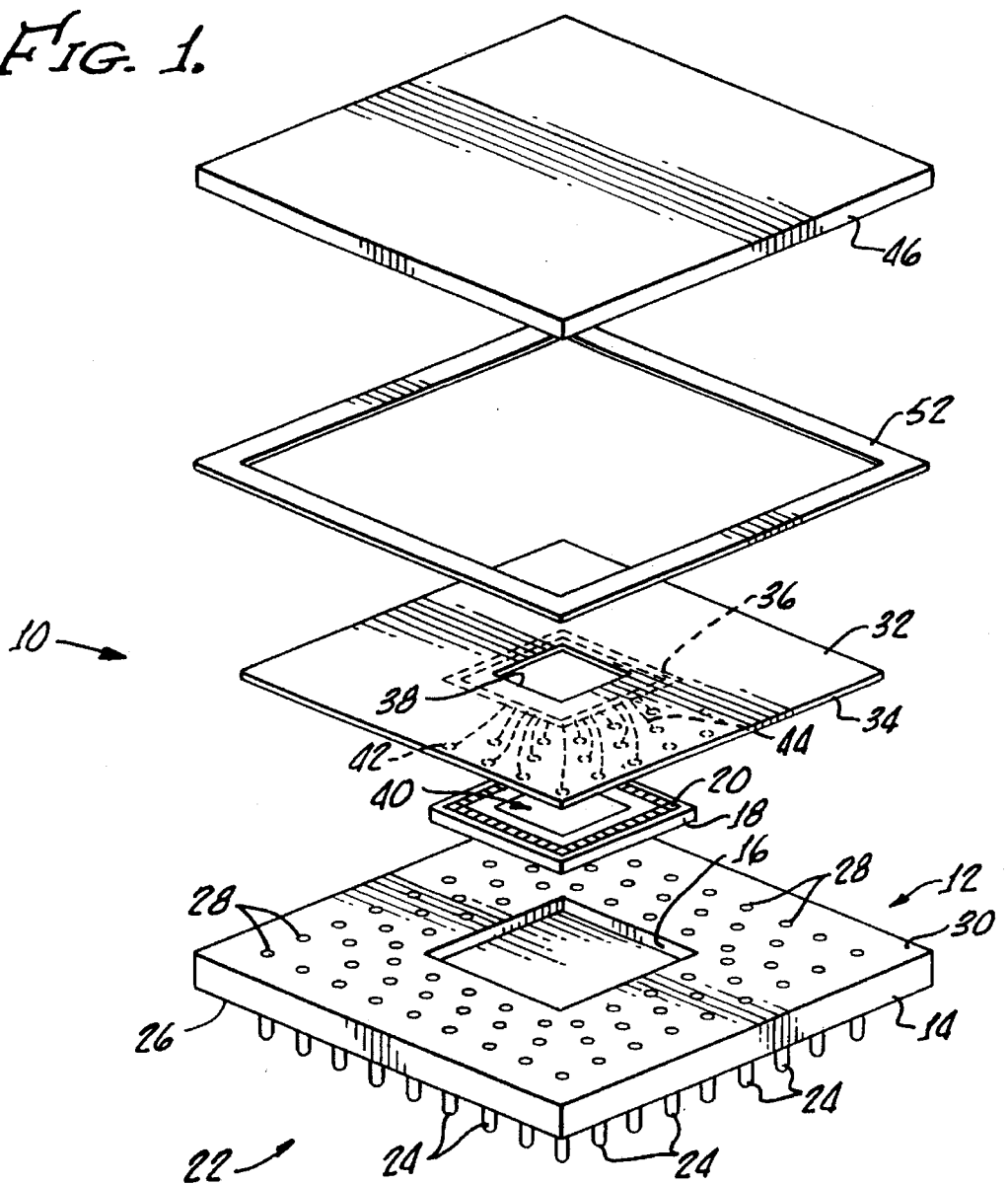
FIG. 1 is an exploded perspective view of an integrated circuit assembly with a package having a base and cover portions, an integrated circuit chip, and electrical interconnection device.
Figure 2:
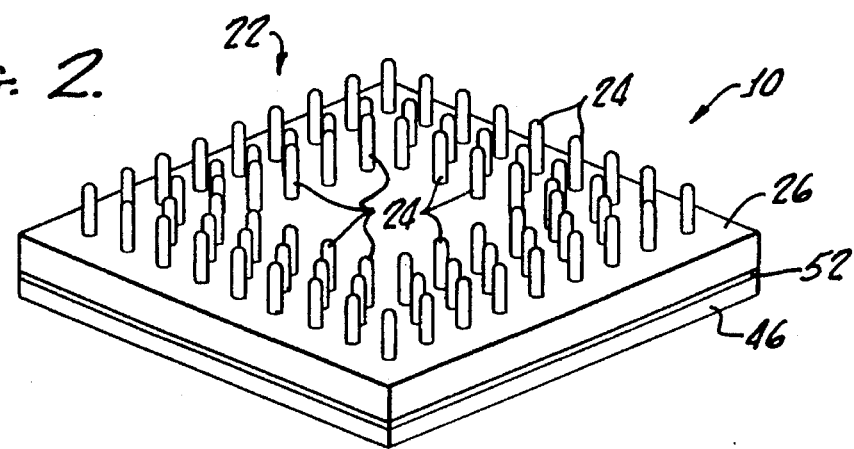
FIG. 2 is a perspective view showing the bottom surface of the integrated circuit package.

Viewing FIGS. 1, 2, and 3, in conjunction, a plastic-package pin-grid array integrated circuit assembly 10 is depicted in exploded view. The integrated circuit assembly 10 includes a two-part package, generally indicated with the numeral 12. This package 12 includes a base portion 14, which is a generally planar body of plastic material. The base portion 14 is generally square or rectangular in planform, and defines a recess 16 into which an integrated circuit chip or die 18 is receivable. Adjacent to its perimeter, the circuit chip 18 includes a plurality of fine-dimension electrical contact pads 20. For example, these contact pads 20 are used for the making of electrical power, ground, and signal input, output and control connections to the chip 18.

FIGS. 2 and 3 show that the base portion 14 includes a plurality 22 of connector pins (individually referenced with the numeral 24) dependent from the lower surface 26 of the base portion. These connector pins 24 each have a corresponding connection surface 28 exposed at an upper surface 30 of the base portion, and each individual connector pin 24 finds correspondence with a particular contact pad 20 on the circuit chip 18.

In order to effect electrical connection between the contact pads 20 and the corresponding connector pins 24, the integrated circuit assembly 10 includes a thin rectangular TAB (tape automated bonding) member 32. This TAB member 32 includes a thin polymer film member 34. Upon the film member 34 is carried an array of electrical contacts 36 surrounding a central opening 38. This central opening 38 corresponds to the central area 40 of integrated circuit elements on the chip 18. The arrangement of the contacts 36 matches that of the peripheral array of contact pads 20 on the chip 18. Similarly, the film 34 carries an array of contacts 42 matching the array of connector pins 22 at their upper surfaces 28 on surface 30 of the base portion 14.

The contacts 32 and contacts 38 of TAB 32 are connected correspondingly with one another individually by a plurality of conductive traces 44 extending therebetween across the film 34. When the film 34 is placed congruently over the base 14 and integrated circuit chip 18 in recess 16, the contacts 36 connect with the peripheral contact pads 20, and contacts 42 connect with the upper ends 28 of the connector pins 24.

The film 34 is self-adhesive or is secured in place with a separate adhesive. The electrical connection of the contacts 36 and 42 of TAB 32 with the contacts 20 of the chip 18, and with the pins 22 of the base member 14 may be accomplished with simple surface contact conduction between these contacts, or may also be effected with a solder reflow step, for example. The use of TAB technology is well-known in the semiconductor integrated circuit packaging art. It should be understood that the invention could also be used in connection with a wire bonded integrated circuit chip, or die. In this instance the die 18 would be directly bonded to the base 14 without the TAB interposer 32.

Still viewing FIG. 1, it is seen that the package 12 includes a cover portion 46 which sealingly cooperates with the base portion 14 to provide a sealed and protected environment for the integrated circuit chip 18. FIG. 3 shows that the base portion 14 and cover portion 46 are both fabricated of a woven fibrous material (generally referenced with the numeral 48), which is carried in a matrix 50 of polymer or resinous material. By way of example only, the fibrous material 48 may be a glass fiber cloth, and the matrix material may preferably be an epoxy resin. Of course, other material may be chosen for the base and cover portion of the package 12 within the scope of the present invention. Also, the fibrous material 48 need not be woven, but may be a random matted or felted material, for example. Also, the fibers of this fibrous material need not be glass fibers, but may be made of other suitable materials.

During manufacturing of the integrated circuit assembly 10, the base portion 14 and cover portion 46 are formed of the same material, as explained. The chip 18 is secured into the recess 16 of the base portion 14, and the TAB 32 is used to effect electrical interconnection between the pins 22 of base portion 14 and the chip 18. Thereafter, the cover portion 46 is sealingly attached to the base portion 14. In order to effect this sealing attachment of the cover portion 46 to the base portion 14 while preserving material homogeneity for the package 12, a pre-shaped scrim 52 of b-stage, or partially cured material is used between the base portion 14 and cover portion 46. This scrim 52, as is seen in FIG. 3, includes fibrous material 48 in a matrix 50' of partially cured polymeric or resinous material, which are the same as or compatible with the materials 48 and 50 of the base and cover portions.

When the base portion and cover portion are so united with the scrim 52, and the scrim 52 is cured, the matrix 50 of the package 12 becomes continuous throughout the package. That is, the package 12 is materially homogenous throughout with respect to the structural portions of this package. There are no materially non-homogeneous structural portions of the package which can exert differential thermal expansion stresses on the package, or which can cause staining of the package. As pointed out above, such stressing and straining of an integrated circuit package is transferred to the chip 18, or to the interconnect structures, such as the TAB 32.

FIGS. 4 and 5 depict an integrated circuit package, and integrated circuit assembly including such a package, which is of the surface mount technology plastic package ball-grid array type. In order to obtain reference numerals for use in describing the structures seen in FIGS. 4 and 5, features which are the same as, or which are analogous in structure or function to, features seen in FIGS. 1–3, are referenced with the same numeral used above. When a particular difference appears in an otherwise familiar feature which the reader should notice, the feature is referenced with the same numeral having a prime added thereto, and the difference is pointed out to the reader.

Viewing FIGS. 4 and 5, an integrated circuit package 12, and an integrated circuit assembly 10, having such a package are seen in cross sectional view. In plan view, the integrated circuit assembly 10 and its package 12 would appear much as that seen in FIGS. 1–3. However, rather than having a plurality of depending connector pins arrayed on its lower surface 26, the integrated circuit assembly 10 of FIGS. 4 and 5 is configured for surface mount technology with a multitude of solder balls 54 disposed on the lower surface 26 of the package 12 in an array similar to that of the pins 22 seen in FIG. 2. The package 12 carries an outermost layer 56 of solder-resist material on the surface 26. A metallic layer 57 resides under the solder resistant layer 56 and adjacent the bottom lamina 62. The layers 56 and 57 define a plurality of openings 58, and one of the solder balls 54 is disposed in each of the openings 58. As FIGS. 3 and 4 depict, the package 12 includes conductive vias 60 (only two of which are visible in FIGS. 4 and 5), and which are exposed on the lower surface 26 of the package 12 in the openings 58 of the solder resist material 56. Each of the solder balls 54 is joined in physical and electrical contact with a corresponding one of the conductive vias 60. Within the package 12, the conductive vias 60 connect to respective contact pads 20 on a chip 18 as was explained above, and as will be further explained.

Viewing FIG. 4, it is seen that the package 12 is a built up composite structure including plural principal laminae, or layers 62, 64, 66, and 68. In general terms, the upper two principal laminae 66 and 68 cooperate by means of an aperture in the layer 66 to define a cavity 16 for the chip 18, which cavity is open downwardly. The chip 18 is received into this cavity 16 with its contacts 20 downward. The TAB device 32 is received under the chip 16 to connect with the contacts 20 in order to provide electrical connection with the solder balls, as will be further explained. The lower layer 62 of the laminated package 12 includes an outer peripheral portion 62a which carries the array of plural solder balls 54, and through which the vias 60 extend. Within the outer peripheral portion 62a, the layer 62 includes also an inner or cover portion 62b. This cover portion 62b completes the lower surface 26 of the package 12, and sealingly cooperates both with the portion 62a, and with the layer 64, to enclose the integrated circuit chip 18 and the TAB 32.

Viewing FIG. 5 more particularly, the composite laminated package 12 is seen to include the layers 62–68, each of which is fabricated of the same composite fibrous material in a polymeric or resinous matrix seen above with respect to the embodiment of FIGS. 1–3. Package 12 also includes plural intervening layers of b-stage scrim material 52. In the finished laminated composite package, as is seen in the drawing Figures, it will be understood that the scrim material is cured. However, during manufacture of the laminate package, these scrim layers will be united with the laminae 62–68 in its b-stage, or partially cured condition, so that subsequent curing of the scrim material effects sealing cooperation and uniting of the laminae 62–68 into a materially uniform or homogeneous package.

Still viewing FIG. 5, it is seen that each of the laminae or layers 62, 64 (as well as layers 66 and 68) carry one or two thin facial metallic coatings. That is, the bottom lamina 62 carries an upper metallic coating 72 and a lower metallic coating 57 under the solder resistant layer 56. The lamina 64 carries both a lower metallic coating 74, and an upper metallic coating 76. Lamina 66 is seen to carry a lower metallic coating 78, and may also carry an upper metallic coating (not seen in the drawing Figures). Similarly, the upper lamina 68, seen in FIG. 4 may carry upper or lower metallic facial coatings. Each of these facial metallic coatings is comparatively thin, on the order of a few mills or less in thickness, and does not compromise the material homogeneity of the package 12 by its presence among the laminae 62–68. Similarly, the adjacent facial metallic coatings are separated from one another both physically and electrically by the intervening layers of scrim material 52.

As is best seen in FIG. 5, the facial metallic coating layers 72, 74 and 76 define respective openings 80, 82, and 84, through which the conductive vias 60 pass without making electrical contact. It will be apparent however, that any one or more of the conductive vias 60 can make electrical contact with one or more of the facial metallic coating layers 72–78. Thus, the metallic coating layers 72–78, or a selected portion or portions of one or more of these layers may be employed as connecting planes in the package structure 12 between selected ones of the conductive vias 60. Accordingly, the conductive vias 60 and connecting metallic layer portions may be employed to define power distribution, ground, and signal interconnects within the package 12, which are then connected to the contact pads of the integrated circuit die as desired by the TAB 32. The facial metallic coating layers 72–78 are similar to the metallic coatings found on printed circuit boards, and may be patterned in the same or similar ways to effect the interconnections desired within the package 12 for the integrated circuit assembly.

Still viewing FIG. 5, it is seen that the conductive vias 60 connect at the plane of the facial metallic coating 78, as does the TAB 32. This metallic coating layer 78 may be patterned to define conductive trace portions connecting selected ones of the conductive vias 60 to corresponding ones of the contact pads 20 of the die 18. Further, the conductive vias 60 may extend upwardly in the circuit package 12 to facial metallic layers (not seen in the drawing Figures) disposed on the upper side of the layer 66 and on the lower side of layer 68, for example, in order to effect additional electrical interconnections within the integrated circuit package 12. Electrical and electromagnetic shielding for the integrated circuit die 18 may also be effected by use of the facial metallic coating layers 72–78. That is, a facial metallic coating layer of a ferromagnetic metal may provide effective electromagnetic shielding for the circuit die 18. Grounding of this or another layer in the package 12, may effect shielding with respect to electrostatic fields in the use environment of the circuit assembly 10.

FIG. 6 provides a cross sectional view of yet another alternative embodiment of the present invention, similar to that of FIG. 4. Again, familiar features are referenced with the same numerals used above. In the embodiment of FIG. 6, the package 12 is formed of plural laminae 62, 64, and 66, made of the same fibrous material and matrix material explained above. The package includes a base portion 14 which includes the three lamina 62–66, and which defines a recess 16 into which the chip 18 is received. A TAB 32 is carried on the chip 18 and lamina 64, and provides connection to plural solder balls 54 by conductive vias 60, and by traces formed or patterned on the metallic facial layer (not visible in FIG. 6) of the lamina 64. As explained above, the laminae 62–66 are sealingly secured together by interposed scrim 52 of woven glass fibers in an epoxy matrix. As explained above, these scrim are placed in a b-stage, or partially cured condition during manufacture of the integrated circuit assembly 10.

However, in contrast to the previous embodiments, the package of FIG. 6 is formed with the layer or lamina 66 carrying at least a peripheral facial metallic coating layer 86 circumscribing an opening 88 which leads to the chip 18 and TAB 32. A cover portion 46, also formed of the same woven fibrous material in an epoxy matrix is received over and closes the opening 88. This cover member 46 includes a lower peripheral facial metallic coating layer 90 which is congruent with the layer 86 immediately outside of the opening 88. These metallic coating layers 86 and 90 are soldered together, as is indicated with the arrow 92, to form a solder bond between the base portion 14 and cover portion 46. The solder bond 92 is continuous around the opening 88 so that the package sealingly encloses the integrated circuit die 18. If desired, an encapsulant may be used in the cavity 16 and opening 88 to assist in protecting the chip 18 and TAB 32 from physical shock and vibration. As before, the package 12 includes base and cover portions which are matched to one another in their thermal coefficient of expansion. Consequently, the package 12 does not generate any thermal stresses during operation of the circuit chip 18 which could be transferred to this chip or to the TAB 32.

In view of the above, it is seen that the present invention provides an integrated circuit package, and an integrated circuit assembly having such a package, in which the package is materially uniform with respect to its structural components. This material uniformity or homogeneity of the package prevents differential thermal expansions, and prevents stresses and straining of the package which could be transferred to the integrated circuit die, or to the interconnect structures of the package or assembly. Preferably, the package is fabricated of a fibrous reinforced polymeric or resinous matrix material. The fibrous reinforcing may be glass fibers, for example, and may be matted, felted, or preferably woven. The matrix material is preferably resinous epoxy, although a variety of other thermoset or thermoplastic polymer materials, and other resinous materials, which are well known in the pertinent art may be employed.

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

I claim:

1. An integrated circuit assembly having an integrated circuit die, and a package enclosing said die and providing for electrical interconnection of said die to external electrical circuitry, said package comprising:

a first package portion providing a recess into which said integrated circuit die is received;

a second package portion sealingly cooperating with said first package portion to enclose said integrated circuit die within said recess;

means for effecting corresponding individual electrical interconnection between plural electrical contact pads of said integrated circuit die and plural electrical connection features defined on said package for connection with said external electrical circuitry;

wherein:
said package portions are materially uniform and matched in thermal coefficient of expansion to one another;
said package portions are each formed of the same composite material including a matrix of a fibrous material in a resinous material;
said fibrous material includes glass fibers;
said resinous material includes an epoxy resin; and
said package portions are sealingly secured together by a scrim formed of said epoxy resin carried in a fibrous material.

2. The integrated circuit assembly of claim 1 wherein said fibrous material of said scrim includes glass fibers.

3. The integrated circuit assembly of claim 1 wherein said means for effecting electrical interconnection includes a facial metallic coating layer carried on a portion of said package.

4. The integrated circuit assembly of claim 1 wherein said electrical interconnection with said external electrical circuitry is effected by means of configuring said package to define an external electrical interconnection structure selected from the following group: a pin grid array, or a solder ball array.

5. The integrated circuit assembly of claim 3 wherein one of said package portions includes plural laminae each formed of said composite material, and said laminae are secured together by interposed scrim of said epoxy resin carried in said fibrous material.

6. The integrated circuit assembly of claim 5 wherein one of said plural laminae carries said facial metallic coating layer.

7. A package for an integrated circuit die, said package comprising:
a first and a second package portion each configured to sealingly cooperate with the other to sealingly enclose said integrated circuit die and to effect electrical interconnection of said die with external electrical circuitry, each of said first and second package portions being formed of composite material including woven fibrous material in a resinous or polymeric matrix;
wherein:
said package further includes one of said package portions being formed of plural laminae each of woven fibrous material in a resinous or polymeric matrix, and each of said laminae being joined to an adjacent laminae by a scrim of woven fibrous material in a resinous or polymeric matrix, and said fibrous material and said matrix material of said package portions and laminae being alike to one another so that said package portions including said laminae are matched to one another in thermal coefficient of expansion.

8. The integrated circuit package of claim 7 wherein said package portions are further sealingly secured to one another by a scrim of woven fibrous material in a resinous or polymeric matrix.

9. The integrated circuit package of claim 7 wherein at least one of said plural laminae carries a facial metallic coating layer, said facial metallic coating layer being electrically conductive, and said coating layer further providing one of electrical interconnection, electrostatic shielding, or electromagnetic shielding for said integrated circuit die.

10. The integrated circuit package of claim 8 wherein said scrim sealingly securing said package portions together is also alike to said package portions, being formed of the same fibrous material and the same resinous or polymeric material.

11. An integrated circuit assembly comprising:
an integrated circuit die;
a package structure for said integrated circuit die, which package structure provides environmental and physical protection, and electrical interconnection to external electrical circuitry for said integrated circuit die, said package structure including:
a first and a second package portions which are each formed of woven fibrous material in a matrix of resinous or polymeric material, and which sealingly cooperate with one another to enclose said circuit die,
internal interconnection means for electrically interconnecting plural contact pads of said integrated circuit die with corresponding electrical conductors of said package structure,
external interconnection means for electrically interconnecting said electrical conductors of said package structure with external electrical circuitry; and
a scrim formed of said woven fibrous material in said matrix of resinous or polymeric material for sealingly securing said package portions together.

12. The integrated circuit assembly of claim 11 wherein said package portions are each formed of woven glass fiber in an epoxy matrix.

13. The integrated circuit assembly of claim 12 wherein one of said package portions includes plural laminae each of woven glass fiber in an epoxy matrix, and at least one of said plural laminae carrying a facial metallic coating layer.

* * * * *